(12) United States Patent
Verbrugge et al.

(10) Patent No.: US 6,947,855 B2
(45) Date of Patent: Sep. 20, 2005

(54) ADAPTIVE ALGORITHM TO CONTROL AND CHARACTERIZE SUPER-CAPACITOR PERFORMANCE

(75) Inventors: Mark W. Verbrugge, Troy, MI (US); Damon R. Frisch, Troy, MI (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 10/637,025

(22) Filed: Aug. 7, 2003

(65) Prior Publication Data

US 2005/0033535 A1 Feb. 10, 2005

(51) Int. Cl.[7] .............................................. G01R 31/36
(52) U.S. Cl. ........................ 702/63; 320/132; 320/167
(58) Field of Search ................................ 702/57, 60–65, 702/117, 118, 124, 126, 183–188; 320/132, 136; 324/428, 433, 426, 427, 430, 410, 148, 149, 167; 706/2

(56) References Cited

U.S. PATENT DOCUMENTS

| | | | | |
|---|---|---|---|---|
| 5,444,378 A | * | 8/1995 | Rogers ........................ | 324/428 |
| 6,160,380 A | * | 12/2000 | Tsuji et al. .................. | 320/132 |
| 6,160,382 A | * | 12/2000 | Yoon et al. .................. | 320/136 |
| 6,359,419 B1 | | 3/2002 | Verbrugge et al. .......... | 320/132 |
| 6,362,598 B2 | * | 3/2002 | Laig-Horstebrock et al. ........ | 320/132 |
| 6,392,415 B2 | * | 5/2002 | Laig-Horstebrock et al. ....... | 324/433 |
| 6,441,586 B1 | | 8/2002 | Tate, Jr. et al. ............. | 320/132 |
| 6,456,988 B1 | * | 9/2002 | Singh et al. .................... | 706/2 |

FOREIGN PATENT DOCUMENTS

| | | | |
|---|---|---|---|
| JP | 2001-307780 | * | 11/2001 |
| JP | 2002-122642 | * | 4/2002 |

OTHER PUBLICATIONS

Buller/Karden/Kok, De Doncker, "Modeling the Dynamic Behavior of Supercapacitors Using Impedance Spectroscopy", IEEE Transactions on Industrial Applications, vol. 38, No. 6, Nov./Dec. 2002, pp. 1622–1626.

Chu/Braatz, "Comparison of commericial supercapacitors and high–power lithium–ion batteries for power–assist applications in hybrid electric vehicles", 2002 Elsevier Science B.V., Journal of Power Sources 112, pp. 236–246.

Huang/Xie/He/Sun/Tong/Xie, "Electric Double Layer Capacitors Using Activated Carbon Prepared from Pyrolytic Treatment of Sugar as Their Electrodes", 2003 Elsevier Science B.V., Synthetic Metals 135–136, pp. 235–236.

Jung/Kim/Kim/Lee, "Development of ultracapacitor modules fro 42–V automotive electrical systems", 2003 Elsevier Science B.V., Journal of Power Sources 114, pp. 366–373.

Verbrugge/Conell, "Electrochemical and Thermal Charaterization of Battery Modules Commensurate with Electric Vehicle Integration", Journal of The Electrochemical Society, 149 (2002), pp. 1–9.

* cited by examiner

*Primary Examiner*—Marc S. Hoff
*Assistant Examiner*—Mohamed Charioui
(74) *Attorney, Agent, or Firm*—Kathryn A. Marra

(57) ABSTRACT

A method for determining a state of charge (SOC) of a super-capacitor (SC) system includes modeling the SC system with an equivalent circuit having first and second parameters. The method further includes estimating a value of the first and second parameters based on a measured voltage and determining the SOC based on the first and second parameters.

26 Claims, 2 Drawing Sheets

US 6,947,855 B2

ADAPTIVE ALGORITHM TO CONTROL AND CHARACTERIZE SUPER-CAPACITOR PERFORMANCE

FIELD OF THE INVENTION

The present invention relates to super-capacitors, and more particularly to characterizing super-capacitor performance, such as a state of charge (SOC), a state of health (SOH), and a power capability forecast.

BACKGROUND OF THE INVENTION

Hybrid electric vehicles (HEV's) and fuel cell vehicles (FCV's) have been developed in an effort to provide a more efficient and environmentally friendly transportation option. In these vehicles, a power assist device is implemented to provide power for acceleration, to recapture electrical energy during regenerative braking and to store electrical energy. Traditionally, battery systems have been employed to provide these functions.

Super-capacitor's (SC) have been considered as an alternative to batteries to provide the above-described functions. An SC is an energy storage device that includes both battery and traditional capacitor characteristics. The SC can be charged and discharged quickly, but exhibits significantly enhanced capacitance over traditional capacitors. As a result, the SC can supply power for vehicle acceleration and/or for auxiliary electrical components and store energy generated during operation of the vehicle.

The state of charge (SOC) of an SC indicates the amount of usable energy stored within the SC at a given time. It is analogous to the amount of fuel in a fuel tank. In order to improve vehicle power management, it is beneficial to know the SOC of the SC at any given moment. The state of health (SOH) of an SC indicates the physical condition of the SC. The SOH is based on observing particular SC parameters to determine the extent of unobservable, internal damage or degradation. The power capability of the SC is useful in the optimal operation of a vehicle with more than one power source (e.g., a SC and an internal combustion engine), as the vehicle controller can allocate effectively the power requests to the various power devices.

SUMMARY OF THE INVENTION

Accordingly, the present invention provides a method for determining a state of charge (SOC) of a super-capacitor (SC) system. The method includes modeling the SC system with an equivalent circuit having first and second parameters and estimating a value of the first and second parameters based on a measured voltage. The method further includes determining the SOC based on the first and second parameters.

In one feature, the first parameter is a resistance and the second parameter is a capacitance. The resistance represents ohmic resistance within the SC system and the capacitance represents dynamics within the SC system.

In another feature, the step of determining the SOC includes calculating a voltage-based component of the SOC based on the first and second parameters and calculating a current-based component of the SOC based on the second parameter. The SOC is determined based on a combination of the voltage-based component and the current-based component.

In still another feature, the step of estimating the first and second parameters includes providing a recursive linear relationship to determine a predicted voltage based on prior estimates of the first and second parameters and minimizing an error between the measured voltage and the predicted voltage by updating the first and second parameters.

In another feature, the method further includes determining a state of health (SOH) of the SC system based on the first and second parameters.

In yet another feature, the method further includes determining a power capability of the SC system for charge and discharge based on the first and second parameters and allowable voltages of the SC system.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses.

Figure 1:
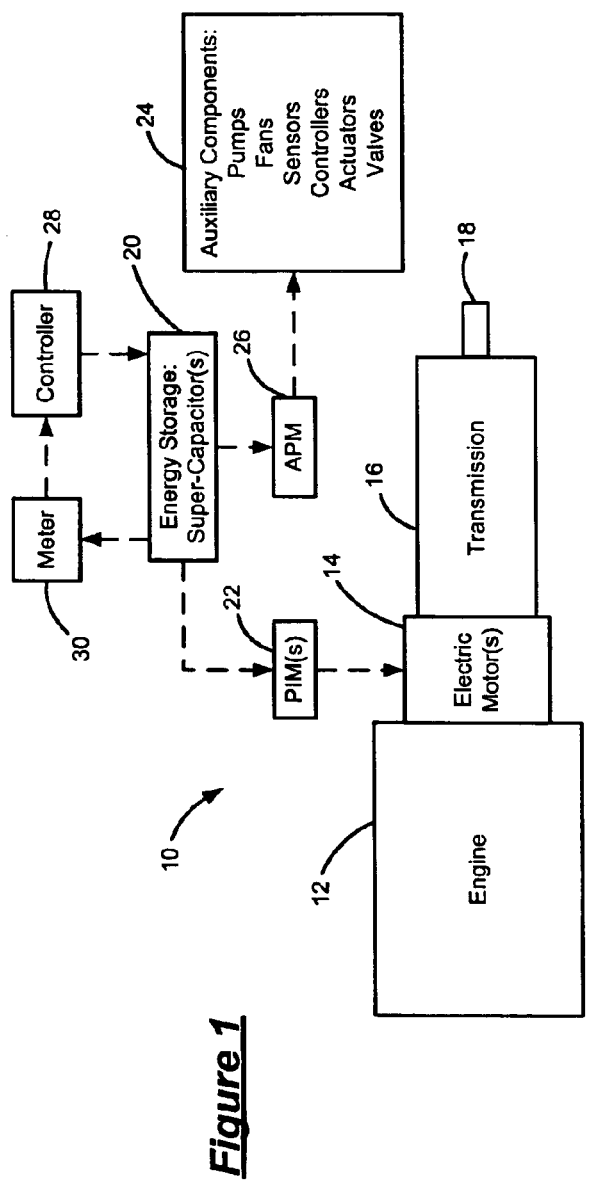
FIG. 1 is a functional block diagram illustrating an electric hybrid vehicle including a super-capacitor (SC) energy storage device.

Referring now to FIG. 1, a functional block diagram illustrates a hybrid-electric vehicle (HEV) 10. The HEV 10 includes an internal combustion engine (ICE) 12 and one or more electric motors 14 for driving a transmission 16. When operating in a first mode, the engine 12 drives the transmission 16. When operating in a second mode, the electric motor 14 drives the transmission 16. The transmission 16 includes a drive output 18 that drives wheels (not shown) of the HEV 10.

The electric motor 14 is driven using electrical energy that is stored in a super-capacitor (SC) system 20. The SC system 20 can include a single SC or multiple SC energy storage devices. Electrical energy is provided to the electric motor 14 through a power inverting module (PIM) 22. In the case of multiple electric motors 14, multiple PIM's 22 may be provided. The SC system 20 also provides electrical energy to power auxiliary components 24. Exemplary auxiliary components include pumps, fans, sensors, controllers, actuators, valves and the like. Electrical energy is provided to the auxiliary components through an auxiliary power module (APM) 26. Other electrical power supply devices can be included, such as, but not limited to an engine driven generator or a regenerative braking generator (not shown).

A controller 28 monitors voltage and current of the SC system 20 based on signals from a meter 30. More specifically, the meter 30 measures the terminal voltage and terminal current of the SC system 20 and generates voltage and current signals that are sent to the controller 28. The controller 28 determines the state of charge (SOC) and state of health (SOH). Additionally, the controller 28 includes power management capabilities as explained in further detail below.

It can be appreciated that the HEV 10 described herein is an exemplary platform for implementing the present invention. It is anticipated that the present invention is applicable in other vehicles that implement an SC system. Other exemplary vehicles include traditional ICE-driven vehicles, electric vehicles (EV's) and fuel cell vehicles (FCV's). It is further anticipated that the present invention is applicable in any other type of platform, including non-vehicle platforms that implement an SC system as an energy storage device.

Figure 2:
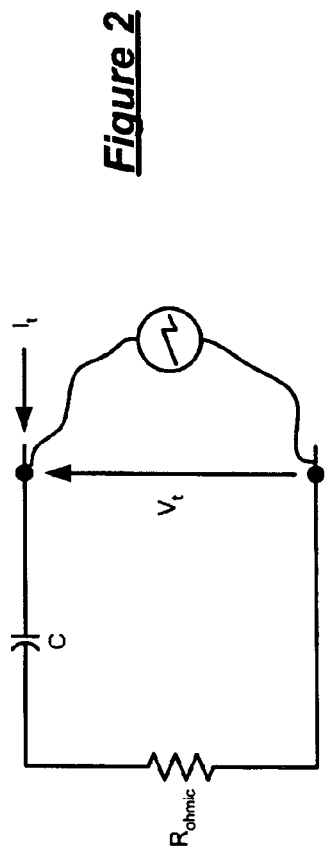
FIG. 2 is a circuit schematic illustrating an exemplary equivalent circuit for modeling the SC.

Referring now to FIG. 2, an equivalent circuit is shown that models the SC system 20 using first and second parameters. More particularly, the SC system 20 is modeled as a circuit having a resistance (R) and a capacitance (C). R is indicative of the ohmic resistance within the SC system 20 and C is indicative of dynamics within the SC system 20. It should be noted that although the equivalent circuit of FIG. 2 models the SC system 20 using first and second parameters, it is anticipated that a more complex equivalent circuit having more parameters can be implemented to more precisely model characteristics of the SC system 20. It is appreciated that the two parameter equivalent circuit described herein provides the most simple model that sufficiently characterizes the SC system 20.

The algorithm of the present invention provides a method of determining the SOC of the SC system 20 based on the first and second parameters. Additionally, the SOH of the SC system 20 can be monitored based on the first and second parameters. The first and second parameters, however, are not directly measurable. A weighted recursive least squares relationship is provided to estimate the first and second parameters based on voltage and current, both of which are directly measured by the meter 30. The weighted recursive least squares relationship is developed from a recursive voltage expression. By summing the voltage around the equivalent circuit of FIG. 2 the following relationship is provided:

$$V = \frac{Q}{C} + IR \quad (1)$$

The relationship between the charge on the SC, Q, and the associated current is provided as:

$$I = \frac{dQ}{dt} \quad (2)$$

The initial condition for V or I corresponds to:

$$V(0) = \frac{Q(0)}{C} + I(0)R \quad (3)$$

It is assumed that the values of R and C do not change substantially over the time scale RC. In other words, it is assumed that R and C change slowly relative to the characteristic time scale RC for the equivalent circuit of FIG. 2. RC is preferably approximately 3 seconds. Differentiation of equation 1 provides:

$$\frac{dV}{dt} = \frac{I}{C} + R\frac{dI}{dt} \quad (4)$$

The solution to this equation for a variable current source is provided as:

$$V = \frac{Q(0)}{C} + IR + \frac{1}{C}\int_{\zeta=0}^{\zeta=t} I|_\zeta \, d\zeta \quad (5)$$

For constant current discharge, the following relationship is established:

$$V = \frac{Q(0)}{C} + IR + \frac{It}{C} \quad (6)$$

The SOC is determined using a voltage-based SOC ($SOC_V$) and a current-based SOC ($SOC_I$). In order to determine $SOC_V$, the superposition integral of equation 5 is converted into a recursive relation. The first few time steps are described herein to illustrate the general pattern. Initially, $t=t_0=0$, and equation 5 is descretized as:

$$V|_0 = Q|_0 \frac{1}{C} + I|_0 R \quad (7)$$

After the first time step ($t=t_1$) the following relationship is provided:

$$V|_0 = (t_1-t_0)\frac{I|_1+I|_0}{2}\frac{1}{C} + I|_1 R + (V|_0 - I|_0 R) \quad (8)$$

where the integrand I has been approximated by the average of its beginning and ending values of the time step. After the second time step ($t=t_2$) the following relationship is provided:

$$V|_0 = (t_2-t_1)\frac{I|_2+I|_1}{2}\frac{1}{C} + I|_2 R + (V|_1 - I|_1 R) \quad (9)$$

This general pattern holds for time step N to provide:

$$V|_N = (t_N-t_{N-1})\frac{I|_N+I|_{N-1}}{2}\frac{1}{C} + I|_N R + (V|_{N-1} - I|_{N-1} R) \quad (10)$$

To determine the voltage at time N ($V|_N$), only the present value of the current and the previous time-step values for the current and voltage are required. Consequently, equation 10 is a recursive transformation of equation 5 into the descretized time domain.

An adaptive procedure is provided for estimating the first and second parameters (R,C) from a history of currents and voltages. This procedure enables state estimation of the SC. A weighted recursive least squares relationship is provided for estimating R and C. Equation 10 is a linear relation as formulated and least squares methods are used to minimize the error ($\epsilon$) between the predicted voltage $V_{PRED}$ and the measured voltage $V_{MEAS}$ by appropriate adjustment of R and C. The following definitions streamline notation:

$$x_1 = I_t - I_{t-\Delta t} \qquad x_2 = (I_t + I_{t-\Delta t})\frac{\Delta t}{2}$$

$$m_1 = R \qquad m_2 = \frac{1}{C}$$

$$y = V_{meas,t} - V_{meas,t-\Delta t}$$

Equation 10 is recast as:

$$y = m_1 x_1 + m_2 x_2 \qquad (11)$$

and $\epsilon$ corresponds to:

$$\varepsilon = \sum_{j=1}^{N} w_j [y_j - (m_1 x_{1,j} + m_2 x_{2,j})]^2 \qquad (12)$$

Time t corresponds to index j=N. Two equations for the two parameters to be extracted can be generated by setting the partials $$\frac{\partial \varepsilon}{\partial m_1} \text{ and } \frac{\partial \varepsilon}{\partial m_2}$$

to zero. This provides:

$$m_1 = \frac{1}{\text{Det}}(V_{1,y} V_{2,2} - V_{2,y} V_{1,2}) \text{ and } m_2 = \frac{1}{\text{Det}}(V_{2,y} V_{1,1} - V_{1,y} V_{2,1}) \qquad (13)$$

where the matrix determinant Det is given by:

$$\text{Det} = V_{1,1} V_{2,2} - V_{1,2}^2 \qquad (14)$$

The variances correspond to:

$$V_{uv}|_N = \left( s_{u,v} \Big|_N - \frac{s_u|_N s_v|_N}{s_w|_N} \right) \frac{1}{s_w|_N} \qquad (15)$$

in which the sums refer to:

$$s_w = \sum_{j=1}^{N} w_j, \; s_u = \sum_{j=1}^{N} w_j u_j, \; s_v = \sum_{j=1}^{N} w_j v_j, \; s_{u,v} = \sum_{j=1}^{N} w_j u_j v_j \qquad (16)$$

u and v refer to $x_1$, $x_2$, or y. It should be noted that the matrix system is symmetric and $V_{1,2} = V_{2,1}$. Variances are used in these expressions along with the normalization associated with the division by $s_w$ in order to keep the resulting matrix elements nearer to unity.

The weight factor $w_j$ enables different weighting of the data sets. The data sets are weighted differently for several reasons. First, some observations are subject to greater disturbance (i.e., a phenomenon not accounted for in the system model). For example, the onset of secondary reactions during SC charging may lead to discounting of the charge observations relative to those of discharge as the impact of the secondary reactions is not treated in the model equations. Second, newer observations are generally more important than older observations in determining the state of the system and therefore are given a larger weight factor relative to older observations. As a result, the weight factor is decomposed into a time-weighting factor $\lambda$ and a general weight factor $\gamma$, the latter of which can be used to weight discharge events over those of charge. Hence, the following relationship is provided:

$$w_j = \gamma_j \lambda^{N-j} \qquad (17)$$

The use of $\lambda^{N-j}$ yields an exponential decay in the influence of past data points on the determination of the current value of $m_i$ and b, as represented by:

$$\lambda^{N-j} = e^{\ln \lambda^{N-j}} = e^{(N-j)\ln \lambda} \approx e^{-(N-j)(1-\lambda)} \text{ for } \lambda \to 1 \qquad (18)$$

Thus $\Delta t/(1-\lambda)$ reflects the time constant over which past points impact the regression analysis. For example, if $\Delta t$ is kept near one second and $\lambda = 0.99$, then the time constant is $=(1 \text{ s})/(1-0.99) = 100$ s. Hence, a data point taken 100 s prior to the current point has less than 40% of the impact on the regression analysis relative to that of the current point. Likewise, a data point taken 500 s prior to the current point has less than 1% of the impact on the regression relative to that of the current point. The summations are made recursive with the following definitions:

$$s_w|_N = \gamma_N + \lambda(s_w|_{N-1}),$$

$$s_u|_N = \gamma_N u_N + \lambda(s_u|_{N-1}), s_v|_N = \gamma_N v_N + \lambda(s_v|_{N-1}), \text{ and}$$

$$s_{u,v}|_N = \gamma_N u_N v_N + \lambda(s_{u,v}|_{N-1})$$

with $s_{u,v} = s_{v,u}$. Initially, the definitions are provided as:

$$s_w|_1 = \gamma_1,$$

$$s_u|_1 = \gamma_1 u_1, \; s_v|_1 = \gamma_1 v_1, \text{ and}$$

$$s_{u,v}|_1 = \gamma_1 u_1 v_1.$$

Using the above-described relationships, the first and second parameters (R,C) are extracted from a data stream provided the determinant reflects a well-posed equation system. The first and second parameter values are used along with coulomb counting to construct a relationship to determine SOC. When all of the current goes to charging or discharging the electric double layer associated with the surface of the porous electrodes of the SC (equation 5) can be rearranged to provide:

$$Q = Q(0) + \int_{\zeta=0}^{\zeta=t} I \Big|_\zeta \, d\zeta = C(V - IR) \qquad (19)$$

where Q is the magnitude of the charge on the SC electrodes. $SOC_V$ is defined in terms of the minimum charge on the capacitor ($Q_{min}$) relative to the maximum value ($Q_{max}$) allowed under normal operating conditions. This is provided as:

$$SOC_V = \frac{Q - Q_{min}}{Q_{max} - Q_{min}} \qquad (20)$$

$$= \frac{C(V - IR) - Q_{min}}{CV_{max}|_{I=0} - Q_{min}}$$

$$= \frac{V - IR - V_{min}|_{I=0}}{V_{max}|_{I=0} - V_{min}|_{I=0}}$$

where $Q_{min}$ and $Q_{max}$ correspond to the minimum and maximum voltages ($V_{min}$ and $V_{max}$, respectively) under zero current conditions.

In a similar manner, $SOC_I$ based on coulomb counting is provided as:

$$SOC_I(t) = SOC(t - \Delta t) + \left( \frac{I_t + I_{t-\Delta t}}{Q_{max} - Q_{min}} \right) \frac{\Delta t}{2} \qquad (21)$$

$$= SOC(t - \Delta t) + \frac{1}{C} \left( \frac{I_t + I_{t-\Delta t}}{V_{max}|_{I=0} - V_{min}|_{I=0}} \right) \frac{\Delta t}{2}$$

Both the voltage and current based SOC's contain useful information, and a weighted average is thus rendered to provide the final SOC:

$$SOC = w SOC_I + (1-w) SOC_V \qquad (22)$$

with the weight factor w chosen to be closer to 1 for enhanced stability and closer to zero for increased responsiveness. It should be noted that w should be viewed in the context of the time per point, as the coulomb counting includes time integration, unlike the more-responsive $SOC_V$. For example, at initial vehicle start-up w can be set to zero such that only $SOC_V$ is considered until the vehicle achieves steady-state operation. Once at steady-state, w can be set as desired (e.g., between zero and one) such that both $SOC_I$ and $SOC_V$ are considered.

$SOC_V$ utilizes the adapted resistance R and $SOC_I$ relies on the adapted value for C. In this context both $SOC_V$ and $SOC_I$ are adaptive quantities as is the composite value of SOC. In addition, incrementing is from the previous value of SOC and not from $SOC_I$ in the formulation of $SOC_I$. In this manner, $SOC_I$ is explicitly linked to $SOC_V$.

The first and second parameters are monitored over time to determine the SOH of the SC system 20. More particularly, as the SC system 20 ages and unobservable, internal damage or degradation occurs R increases and C decreases. Initial values for the first and second parameters, taken when the SC system 20 is newer, can be compared to later values to determine the extent of damage and/or degradation. The SC system 20 can be repaired or replaced once the values indicate that the SC system 20 is no longer sufficient.

The present invention further provides power management control based on the first and second parameters. In particular, the power management control enables determination of the available instantaneous power ($P_{INST}$) (i.e., the power available before the charge on the SC is depleted significantly by the discharge event) from the SC system 20 and the available power from the SC system 20 at a future point in time ($P_{FUT}$) (e.g., the next time step). Initially, the maximum discharge power of the SC can be expressed as:

$$P_{max, discharge} = IV = IV_{min} \quad (23)$$

That is, when the SC voltage obtains its lowest acceptable value, the maximum discharge power results. For $P_{INST}$ $V = V(0) + IR$ where $V(0)$ is the system voltage at zero current immediately prior to the discharge ($V(0) = Q(0)/C$, cf. equation 5), and:

$$P_{max,discharge} = IV_{min} = \frac{[V_{min} - V(0)]}{R} V_{min} \quad (24)$$

Similarly, for the instantaneous charge power:

$$P_{max,charge} = IV_{max} = \frac{[V_{max} - V(0)]}{R} V_{max} \quad (25)$$

Equations 24 and 25 do not address transient effects, which are important for times that are greater than ~0.01 RC. In this case, equation 10 is inverted to solve for the current. Consequently the maximum charge and discharge powers available for the time interval $\Delta t$ can be calculated based on the following:

$$I|_t = \frac{V_t - [I_{t-\Delta t}\Delta t/(2C)] - (V - IR)_{t-\Delta t}}{R + [\Delta t/(2C)]},$$

$$P_{max,discharge}(\Delta t) = IV_{min}$$

$$= \left[\frac{V_{min} - [I_{t-\Delta t}\Delta t/(2C)] - (V - IR)_{t-\Delta t}}{R + [\Delta t/(2C)]}\right]V_{min},$$

and $$P_{max,charge}(\Delta t) = IV_{max}$$

$$= \left[\frac{V_{max} - [I_{t-\Delta t}\Delta t/(2C)] - (V - IR)_{t-\Delta t}}{R + [\Delta t/(2C)]}\right]V_{max}.$$

As $\Delta t \to 0$, the transient power calculations match those of the instantaneous power calculation. To implement the transient equations, the respective powers are calculated immediately after determining SOC at time t. In this case, quantities calculated or measured at time t are stored in the variables listed in the respective power expressions at time $t-\Delta t$. The duration corresponding to the desired estimate for power must be stated. For example, if it is desired to know $P_{FUT}$ 2 seconds from the present time step, the current measured and extracted values are placed in the $t-\Delta t$ quantities, t and $\Delta t$ are set to 2 s and the right sides of the above equations yield the desired power estimates. It is also anticipated that the current magnitudes are bounded by maximum and minimum values.

Using $P_{FUT}$, the controller 28 can determine the power sources that can be used to supply a power demand ($P_{DEM}$). For example, $P_{DEM}$ can come from the electric motor 14, the auxiliary components 24 or a combination of both. If $P_{FUT}$ is sufficiently greater than $P_{DEM}$, $P_{DEM}$ can be met by the SC system 20 alone. If $P_{FUT}$ is not sufficiently greater than $P_{DEM}$, the controller 28 can make a power management decision based on control algorithms. For example, the controller 28 can signal another power source (e.g., an engine-driven generator) to provide $P_{DEM}$ or signal the SC system 20 to supply a portion of $P_{DEM}$ and the other power source to supply the remainder of $P_{DEM}$.

Figure 3:
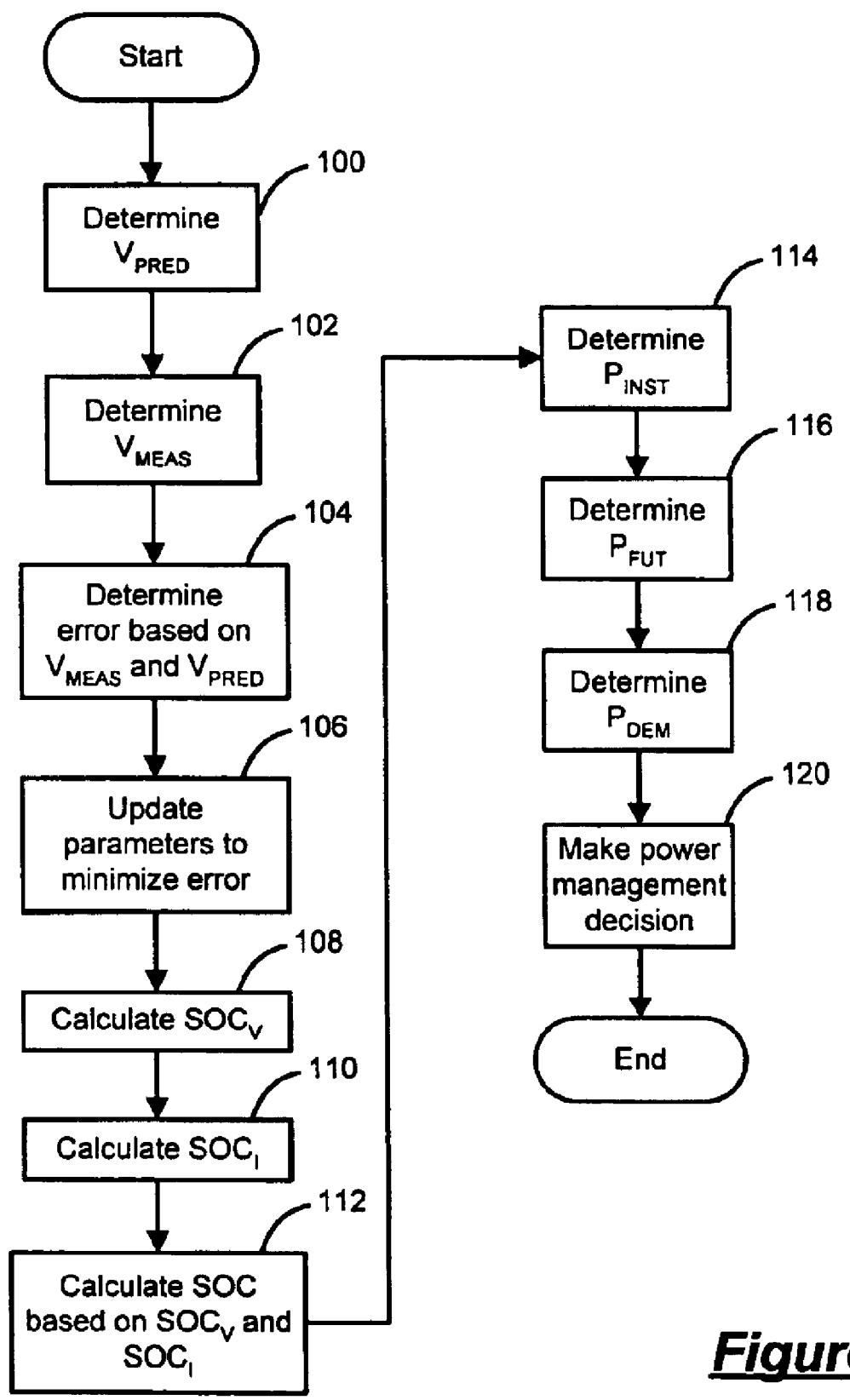
FIG. 3 is a flowchart detailing power management control according to the present invention.

Referring now to FIG. 3, a flowchart illustrates the general SC system state determination and power management control implemented by the controller 28. Initially, in step 100, control determines $V_{PRED}$ based on estimates of the first and second parameters. In step 102, control determines $V_{MEAS}$ and $I_{MEAS}$ based on the signals from the meter. Control determines $\epsilon$ based on $V_{PRED}$ and $V_{MEAS}$ in step 104 and updates the first and second parameters to minimize $\epsilon$ in step 106.

In step 108, control determines $SOC_V$ based on $V_{MEAS}$, $I_{MEAS}$ and the updated first and second parameters. In step 110, control determines $SOC_I$ based on $I_{MEAS}$ and the second parameter. In step 112, control calculates SOC based on $SOC_V$ and $SOC_I$. Control determines $P_{INST}$ based on the first and second parameters, $V_{MEAS}$ and $I_{MEAS}$ in step 114. In step 116, control determines $P_{FUT}$ based on the first and second parameters, $V_{MEAS}$ and $I_{MEAS}$. In step 118, control determines $P_{DEM}$. Control makes a power management decision based on $P_{FUT}$ and $P_{DEM}$ in step 120.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of managing power in a vehicle system incorporating a super-capacitor (SC) energy storage device, comprising:

modeling said SC energy storage device with an equivalent circuit having first and second parameters;

estimating a value of said first and second parameters based on a measured voltage; and determining an available instantaneous power of said SC energy storage device based on said measured voltage and said estimated first and second parameters.

2. The method of claim 1 further comprising determining a state of charge (SOC) of said SC energy storage device based on said first and second parameters.

3. The method of claim 2 wherein said step of determining said SOC comprises:
   calculating a voltage-based component of said SOC based on said first and second parameters;
   calculating a current-based component of said SOC based on said second parameter; and
   determining said SOC based on a combination of said voltage-based component and said current-based component.

4. The method of claim 3 wherein said step of determining said SOC is based on an average of said voltage-based component and said current-based component.

5. The method of claim 1 wherein said first parameter is a resistance, and said second parameter is a capacitance.

6. The method of claim 5 wherein said resistance represents ohmic resistance within said SC energy storage device and said capacitance represents dynamics within said SC energy storage device.

7. The method of claim 1 further comprising measuring a current of said SC energy storage device, wherein said available instantaneous power is further based on said measured current.

8. The method of claim 1 further comprising determining an available future power based on said first and second parameters.

9. The method of claim 1 wherein said step of estimating said first and second parameters comprises:
   providing a recursive linear relationship to determine a predicted voltage based on prior estimates of said first and second parameters; and
   minimizing an error between said measured voltage and said predicted voltage by updating said first and second parameters.

10. The method of claim 1 further comprising determining a state of health (SOH) of said SC energy storage device based on said first and second parameters.

11. A vehicle power management system, comprising:
    an energy storage device including a super-capacitor;
    a voltage measuring device that determines a measured voltage; and
    a controller that estimates a value of first and second parameters based on an equivalent circuit of said energy storage device and said measured voltage and that determines an available instantaneous power of said energy storage device based on said measured voltage and said estimated first and second parameters.

12. The vehicle power management system of claim 11 wherein said controller determines a state of charge (SOC) of said energy storage device based on said first and second parameters.

13. The vehicle power management system of claim 12 wherein said controller determines said SOC by:
    calculating a voltage-based component of said SOC based on said first and second parameters;
    calculating a current-based component of said SOC based on said second parameter; and
    determining said SOC based on a combination of said voltage-based component and said current-based component.

14. The vehicle power management system of claim 13 wherein said SOC is based on an average of said voltage-based component and said current-based component.

15. The vehicle power management system of claim 11 wherein said first parameter is a resistance and said second parameter is a capacitance.

16. The vehicle power management system of claim 15 wherein said resistance represents ohmic resistance within said SC system and said capacitance represents dynamics within said SC energy storage device.

17. The vehicle power management system of claim 11 further comprising a current measuring device that measures a current of said energy storage device, wherein said available instantaneous power is further based on said measured current.

18. The vehicle power management system of claim 11 wherein said controller determines an available future power based on said available instantaneous power.

19. The vehicle power management system of claim 11 wherein said controller estimates said first and second parameters by:
    providing a recursive linear relationship to determine a predicted voltage based on prior estimates of said first and second parameters; and
    minimizing an error between said measured voltage and said predicted voltage by updating said first and second parameters.

20. A method for determining a state of charge (SOC) of a super-capacitor (SC) system, comprising:
    modeling said SC system with an equivalent circuit having first and second parameters;
    estimating a value of said first and second parameters based on a measured voltage;
    calculating a voltage-based component of said SOC based on said estimated first and second parameters and minimum and maximum voltages of said SC system under a zero current condition;
    calculating a current-based component of said SOC based on said second parameter; and
    determining said SOC based on said voltage-based component of said SOC and said current-based component of said SOC.

21. The method of claim 20 wherein said first parameter is a resistance and said second parameter is a capacitance.

22. The method of claim 21 wherein said resistance represents ohmic resistance within said SC system and said capacitance represents dynamics within said SC system.

23. The method of claim 20 wherein said step of determining said SOC is based on an average of said voltage-based SOC component and said current-based SOC component.

24. The method of claim 20 wherein said step of estimating said first and second parameters comprises:
    providing a recursive linear relationship to determine a predicted voltage based on prior estimates of said first and second parameters; and
    minimizing an error between said measured voltage and said predicted voltage by updating said first and second parameters.

25. The method of claim 20 further comprising determining a state of health (SOH) of said SC system based on said first and second parameters.

26. The method of claim 20 further comprising determining a power capability of the SC system for charge and discharge based on the first and second parameters and allowable voltages of the SC system.

* * * * *